(12) United States Patent
Ufert

(10) Patent No.: US 7,649,242 B2
(45) Date of Patent: Jan. 19, 2010

(54) PROGRAMMABLE RESISTIVE MEMORY CELL WITH A PROGRAMMABLE RESISTANCE LAYER

(75) Inventor: Klaus-Dieter Ufert, Unterschleissheim (DE)

(73) Assignee: Infineon Technologies AG, Munich (DE)

( * ) Notice: Subject to any disclaimer, the term of this patent is extended or adjusted under 35 U.S.C. 154(b) by 124 days.

(21) Appl. No.: 11/452,417

(22) Filed: Jun. 14, 2006

(65) Prior Publication Data

US 2007/0267667 A1 Nov. 22, 2007

Related U.S. Application Data

(63) Continuation-in-part of application No. 11/436,898, filed on May 19, 2006, now abandoned.

(51) Int. Cl.
*G11C 11/00* (2006.01)
(52) U.S. Cl. ............... 257/537; 257/528; 257/E27.016; 365/46; 365/148
(58) Field of Classification Search ............... 257/528, 257/529, 536, 537, 350, 379, E27.016, E21.004, 257/E21.006, E27.047, E21.294, E21.495; 365/46, 148; 438/381–385; 369/126
See application file for complete search history.

(56) References Cited

U.S. PATENT DOCUMENTS

| 5,687,112 | A * | 11/1997 | Ovshinsky | 365/163 |
|---|---|---|---|---|
| 6,897,467 | B2 * | 5/2005 | Doan et al. | 257/4 |
| 7,323,708 | B2 * | 1/2008 | Lee et al. | 257/3 |
| 2005/0019975 | A1 | 1/2005 | Lee et al. | |
| 2006/0046379 | A1 | 3/2006 | Symanczyk et al. | |
| 2006/0054950 | A1 | 3/2006 | Baek et al. | |

2006/0291268 A1 12/2006 Happ et al.

FOREIGN PATENT DOCUMENTS

| DE | 103 56 285 | 6/2005 |
|---|---|---|
| DE | 10 2004 041 893 | 3/2006 |
| DE | 10 2005 014 645 | 10/2006 |

OTHER PUBLICATIONS

German Examination Report dated Jan. 19, 2007, directed to counterpart DE application No. 10 2006 023 608.
Seo, S. et al. (2004) "Reproducible Resistance Switching in Polycrystalline NiO Films," Applied Physics Letters 85(23), pp. 5655-5657.
Seo, S. et al. (2005) "Conductivity Switching Characteristics and Reset Currents in NiO Films," Applied Physics Letters 86, 3 pages.
Baek, I. G. et al. (2004) "Highly Scalable Non-volatile Resistive Memory Using Simple Binary Oxide Driven by Asymmetric Unipolar Voltage Pulses," Samsung Electronics Co., Ltd., 26 pages.

(Continued)

*Primary Examiner*—Zandra Smith
*Assistant Examiner*—Paul E Patton
(74) *Attorney, Agent, or Firm*—Patterson & Sheridan, L.L.P.

(57) ABSTRACT

A programmable resistive memory cell comprising a lower electrode, a programmable resistance layer, and an upper electrode, wherein a lower mask is arranged between the lower electrode and the programmable resistance layer and an upper mask is arranged between the programmable resistance layer and the upper electrode, and wherein the lower mask and the upper mask comprise current-inhibiting regions.

22 Claims, 10 Drawing Sheets

OTHER PUBLICATIONS

Clay, R. T. et al. (1998) "Synthesis of Metal Nanoclusters Within Microphase-Separated Diblock Copolymers: Sodium Carboxylate vs. Carboxylic Acid Functionalization," Supramolecular Science 5(1-2), pp. 41-48.

Mulligan, Robert F. et al. (2003) "Synthesis and Characterization of ZnO Nanostructures Templated Using Diblock Copolymers," Journal of Applied Polymer Science 89, pp. 1058-1061.

Landfester, K. "Unconventional Lithography," SFB 569, TP2, Ulm University 2004.

Hönigschmid, H. et al. "A Non-volatile 2Mbit CBRAM Memory Core Featuring Advanced Read and Program Control," Infineon Technologies, 2 pages.

Hickmott, T. W. (1962) "Low Frequency Negative Resistance in Thin Anodic Oxide Films," Journal of Applied Physics 33(9), pp. 2669-2682.

* cited by examiner

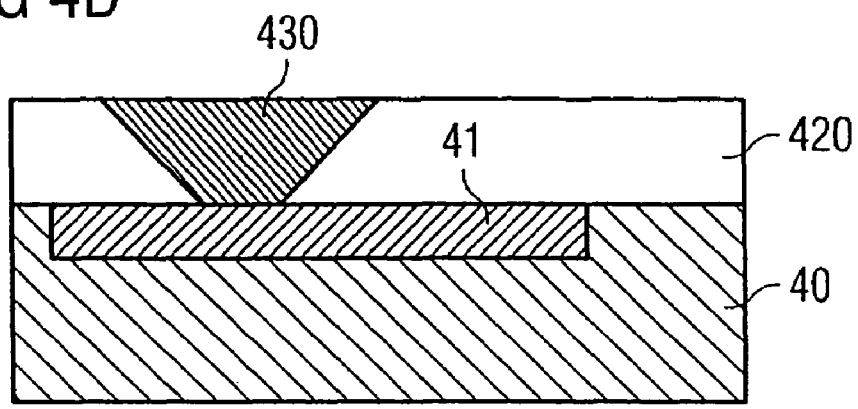
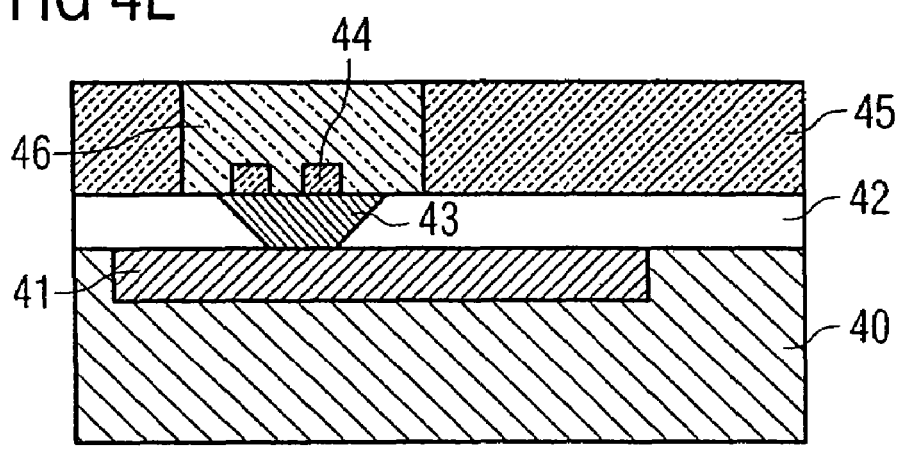
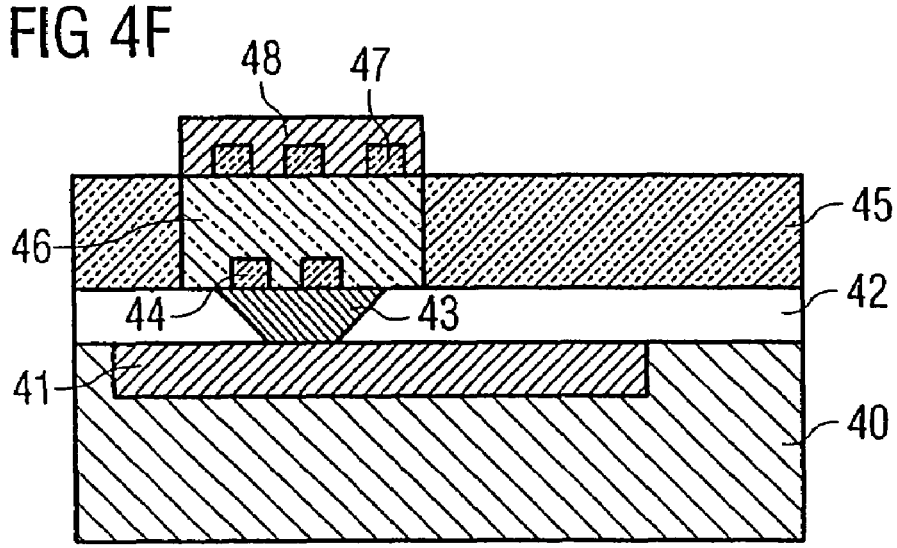

PROGRAMMABLE RESISTIVE MEMORY CELL WITH A PROGRAMMABLE RESISTANCE LAYER

CROSS-REFERENCE TO RELATED APPLICATION

This application is a continuation-in-part of U.S. Ser. No. 11/436,898, filed May 19, 2006, the entirety of which incorporated herein by reference.

TECHNICAL FIELD OF THE INVENTION

The invention relates to a programmable resistive memory cell with a programmable resistance layer and to a method of fabricating a resistive memory cell with a programmable resistance layer.

BACKGROUND OF THE INVENTION

Conventional electronic data memories, for example dynamic random access memory (DRAM) or flash RAM, are increasingly running into limits when they are supposed to satisfy modern requirements. Conventional concepts for electronically storing data, as are also used in DRAM or flash RAM, store information units in capacitors, in which case a charged or uncharged state of a capacitor may represent, for instance, the two logic states "1" or "0".

In the case of DRAM, the capacitors are of extremely small design, in order to achieve high information density and integration, and therefore require the stored information content to be continuously refreshed. In addition to additional memory controllers for the purpose of refreshing, this also requires a considerable amount of power. On the other hand, flash RAM retains the information content stored in it even without power being supplied, but individual flash RAM memory cells are relatively large and require a high voltage for writing information. Modern electronic data memories must therefore be capable of combining high information density, fast access, and non-volatility. In this context, non-volatility denotes the property of an electronic data memory of being able to store information reliably for a considerably long period of time without the need of external power supply.

The requirements in terms of integration density and non-volatility become apparent particularly in the case of mobile applications, since, in that case, available space is limited and batteries—serving as the power supply—may provide only a limited amount of power and also only a limited voltage. In order to combine non-volatility with fast access time and high integration, alternatives for DRAM or flash RAM are subject to intensive scientific and industrial research. In this case, the so-called resistive electronic memories—inter alia—represent a promising concept.

In addition to solid electrolytes, phase transition materials and other special materials, a high-resistive and a low-resistive state may also be imposed on transition metal oxide layers, which, in this way, may serve as a reliable and stable resistive memory cell. By way of example, a logic state "1" may thus be assigned to a low-resistive state and a logic state "0" may be assigned to a high-resistive state. Furthermore, such layers also allow a distinction to be made between a plurality of resistive states, with the result that a plurality of distinguishable logic states may be kept reliably in a single cell, which is also referred to as multibit capability.

The process of storing information in a transition metal oxide (TMO) layer is based on the principle that a low-resistive filament can be formed in a TMO by means of local heating. Local heating may be generated by a current through the TMO which initially has a high resistance. As a result, the filament short-circuits the otherwise high-resistive TMO and thus considerably changes the effective electrical resistance. By means of application of a sufficiently low volatage the resistive and thus the logic state of the memory cell may be determined via measuring a resulting current. An existing filament may be interrupted again using a sufficiently high current and the TMO memory cell thus reverts to a high-resistive state. This process is reversible and has also already been shown at technically relevant repetition rates in the range of $10^6$. In general, a TMO memory cell may be formed from a lower electrode, an upper electrode and a TMO layer arranged in between said electrodes. The minimum size in this case of such a TMO memory cell is primarily given by lithographic restrictions as far as the patterning of the electrodes is concerned.

An individual filament which considerably reduces the electrical resistance of a TMO memory cell often has a much smaller cross section than the minimum contact area of the electrodes which can be achieved using modern lithography and patterning techniques. During an initial programming step, a plurality of filaments begin to form until a first continuous filament short-circuits the upper and lower electrodes. This also terminates the further formation of the residual filaments which do not continue to grow after the short circuit caused by the first contiguous filament. However, the formation of these residual filaments is unnecessary as far as the programming is concerned, since only one individual filament suffices to reliably define the resistive state of the TMO memory cell. The spatial extent and the size of the cross-sectional area of the at least one continuous filament is not subject to any control either and hence the resistivity of a considerable volume of the TMO is changed unnecessarily. Nevertheless, the formation of the residual filaments and the unnecessary altering of volume requires current heating and hence power is consumed unnecessarily. However, it is desired, to keep the power required to write to, and read from, modern electronic data memories as low as possible.

SUMMARY OF THE INVENTION

The present invention provides advantages for an improved programmable resistive memory cell, and an improved method of fabricating a programmable resistive memory cell.

In one embodiment of the present invention, a programmable resistive memory cell is provided, including a lower electrode, a programmable resistance layer, and an upper electrode. A lower mask is arranged between the lower electrode and the programmable resistance layer and an upper mask is arranged between the programmable resistance layer and the upper electrode, wherein the lower mask and the upper mask comprise current-inhibiting regions.

In another embodiment of the present invention, a method of fabricating a resistive memory cell is provided which includes providing a lower electrode; providing a lower mask comprising current-inhibiting regions; providing a programmable resistance layer; providing an upper mask comprising current-inhibiting regions; providing an upper electrode.

BRIEF DESCRIPTION OF THE DRAWINGS

These above recited features of the present invention will become clear from the following description, taken in conjunction with the accompanying drawings. It is to be noted, however, that the accompanying drawings illustrate only typical embodiments of the present invention and are, therefore, not to be considered limiting of the scope of the invention. The present invention may admit other equally effective embodiments.

FIGS. 4A through 4H show a schematic view of a programmable resistive memory cell at various stages during production according to a third embodiment of the present invention.

DETAILED DESCRIPTION OF THE INVENTION

Figure 1A:
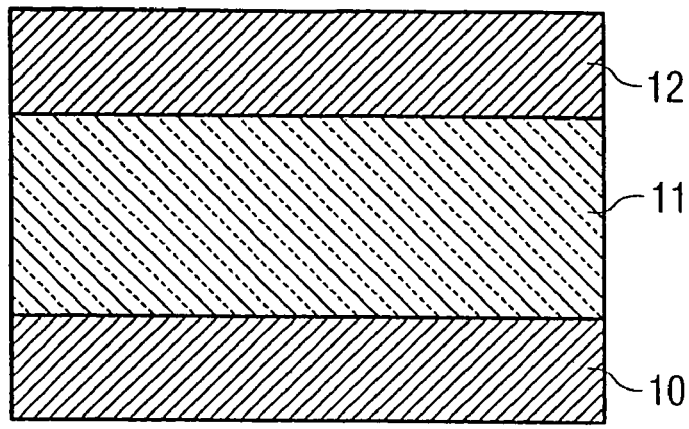
FIGS. 1A through 1C show a schematic view of conventional programmable resistive memory cells.
Figure 1B:
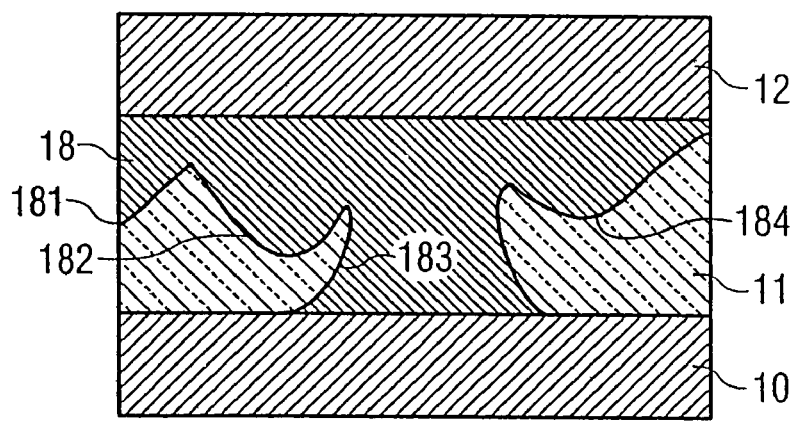

FIG. 1A schematically shows a programmable resistive memory cell having a lower electrode 10, a programmable resistance layer 11 and an upper electrode 12. Applying electrical signals to the lower electrode 10 and upper electrode 12 may generate a current flowing through the programmable resistance layer 11, said current locally heating the programmable resistance layer 11, as a result of which the electrical resistance may be locally changed. A finite local current density in the programmable resistance layer 11 results in local heating and thus, overall, in the formation of a conductive region 18, as shown in FIG. 1B. In this case, the conductive region 18 often comprises a plurality of broad filaments 181, 182, 183 and 184.

As soon as one of the filaments forms a short circuit between the lower electrode 10 and the upper electrode 12, as shown here the broad filament 183, the programmable resistive memory cell assumes a low-resistive state and all of the remaining filaments 181, 182 and 184 do not continue to extend. However, the entire conductive region 18 of the programmable resistance layer 11 was locally heated and its original conductivity was changed until the formation of the continuous broad filament 183. The filaments 181, 182 and 184, for example, are thus unnecessary, since they do not contribute significantly to the conductivity and the power needed to form them is wasted as far as the definition of a low-resistive state of the programmable resistive memory cell is concerned.

Figure 1C:
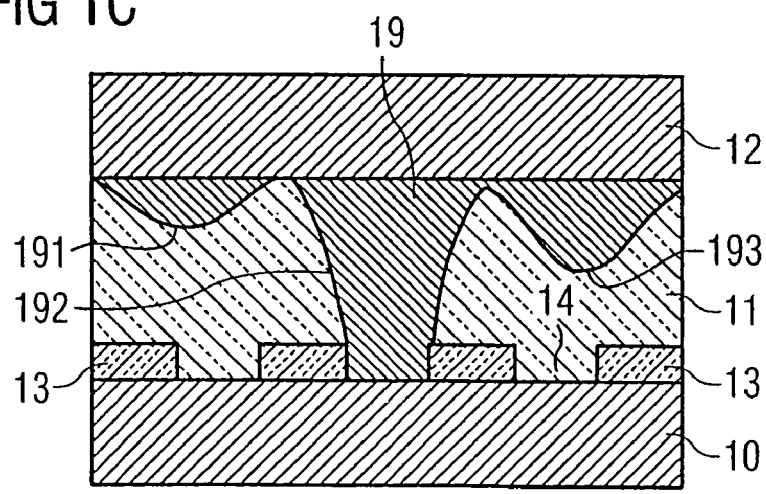

In order to reduce the number of further filaments and their spatial extent, a mask 13 may be provided between the first electrode 10 and the programmable resistance layer 11, as is schematically illustrated in FIG. 1C. The mask 13 considerably restricts the effective contact area of the lower electrode 10 to the programmable resistance layer 11, and narrow filaments 191, 192 and 193 are formed. The mask 13 reduces the effective area of the lower electrode 10 to the openings 14. The filaments are thus only able to form in openings 14 of the mask 13. This reduction in the effective contact area results, on the one hand, in fewer filaments formed, and, on the other hand, in a considerable reduction of the spatial extent of an individual filament, as becomes apparent by comparing the narrow filament 192 to the broad filament 183 shown in FIG. 1B.

Figure 2A:
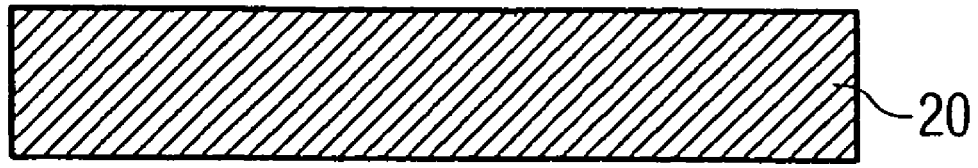
FIGS. 2A through 2F show a schematic view of a programmable resistive memory cell at various stages during production according to a first embodiment of the present invention.

FIGS. 2A to 2F schematically show a programmable resistive memory cell at various stages during production according to a first embodiment of the present invention. Initially, as shown in FIG. 2A, a first lower electrode 20 is provided. This may be effected on a substrate, for example on a silicon substrate or on other functional elements which have already been formed on the substrate 20, as is common in semiconductor fabrication. In this case, the first lower electrode 20 may be provided from an element which melts only at high temperatures, for example tungsten, platinum or palladium, by means of conventional sputtering methods or any other appropriate deposition technique as, for example, vapor deposition, chemical vapor deposition (CVD), or physical layer deposition (PLD). A process atmosphere during provision of the first lower electrode 20 may also comprise an inert process gas, such as an inert noble gas, e.g., argon.

Figure 2B:
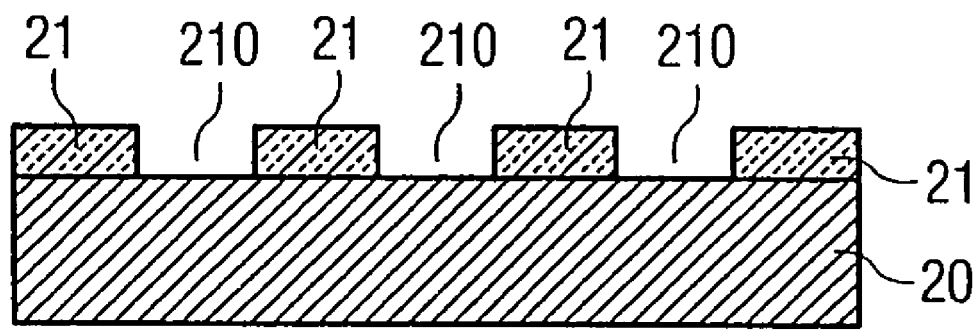

As shown in FIG. 2B, a first lower mask 21 is provided on the first lower electrode 20. In this case, the first lower mask 21 has current-inhibiting regions which are separated from one another by means of openings 210. In this case, the current-inhibiting regions may have a lateral extent in the range of 2 to 20 nm, whereas the openings open regions 210 between the current-inhibiting regions may have a lateral extent in the range of 2 to 20 nm. The layer thickness of the first lower mask 21 may be in the range of 1 to 10 nm. The current-inhibiting regions of the first lower mask 21 may comprise an insulator or a metal oxide, such as zinc oxide, and, may in this way inhibit the formation of filaments in the programmable resistance layer 22 at the sites of the current-inhibiting regions. The first lower mask 21 may be deposited and patterned using conventional lithography and deposition techniques. Furthermore, the first lower mask 21 may be formed by nanoparticles. Said nanoparticles may be formed by means of a self-organized process. One or more nanoparticles form the current-inhibiting regions of the first lower mask 21, while the regions between the nanoparticles form the open regions 210. Although not a requirement, the current-inhibiting regions may be arranged in a periodic manner. The ratio of the current-inhibiting regions and the open regions 210 on one hand determines the current required for programming the programmable resistive cell and, on the other hand, must be chosen such to allow for the formation of at least one continuous filament. The formation of at least one continuous filament is required to define distinguishable high-resistive and low-resistive states of the programmable resistive memory cell.

Deposition of nanoparticles may be effected using so-called diblock copolymers and said nanoparticles may comprise an isolating material. Said diblock copolymers may comprise polynorborenes and polynorborene dicarboxylic acid. In order to provide the first lower mask 21, the copolymers are first synthesized and, after drying, are dissolved again. An appropriate stoichiometric quantity of a metal compound, for example zinc chloride in the case of a desired formation of zinc oxide nanoparticles, is then dissolved in tetrahydrofuran (THF), and being introduced into the solution. Following the above example, the $Zn^{2+}$ cations in the solution then combine with the carboxyl groups in the second copolymer in the block. This solution is then applied to the first lower electrode 20, and the first lower mask 21 grows in a self-organized process, for example in the form of a hexagonal arrangement of zinc oxide nanoparticles. In this case, the solution may be applied by means of spin-coating or by dipping the electrode 20 into the solution. The metal compound can then be converted into a metal oxide using sodium hydroxide (NaOH) and the copolymer can be removed using plasma etching. The first lower mask 21, formed from nanoparticles, then remains on the first lower electrode 20. Appropriately selecting the process parameters allows for variation an tuning of the lateral size of the nanoparticles, and of the open regions between them, both in a range of 1 to 20 nm.

Figure 2C:
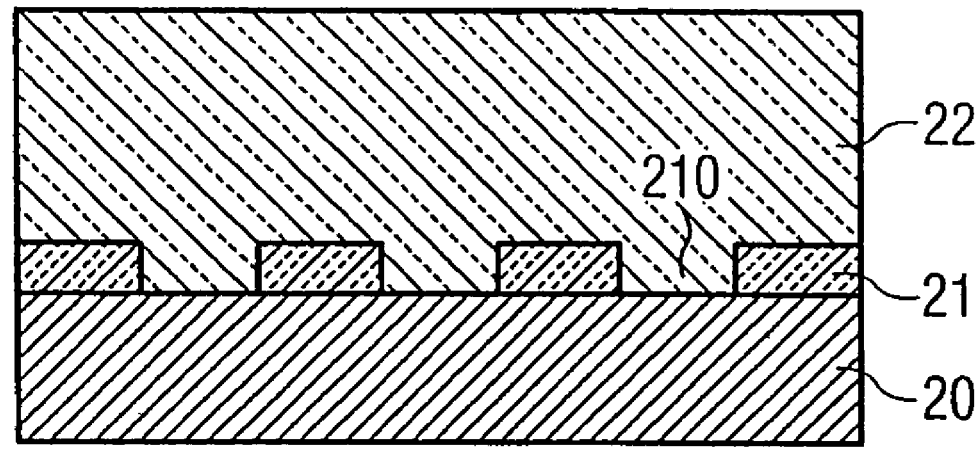

The first lower mask 21 reduces the effective contact area between the first lower electrode 20 and the first programmable resistance layer 22 which, as shown in FIG. 2C, is formed on the first lower electrode 20 and the first lower mask 21. The first programmable resistance layer 22 is formed by means of conventional deposition techniques, for example, reactive sputtering. In this case, one or more transition metals are sputtered in a process atmosphere, which comprises oxygen. The partial pressure of the oxygen in the process atmosphere may be at least saturated so that the sputtered transition metals oxidize in their highest degree of oxidation and thus respectively form a stable saturated oxide. The process atmosphere furthermore may comprise an inert process gas, such as an inert noble gas, e.g. argon. The fraction of an individual transition metal oxide in the resistance layer 22 is determined by the corresponding sputtering rate and the content, determined by said sputtering rate, of sputtered transition metal in the process atmosphere.

The first programmable resistance layer 22 thus contains at least one transition metal oxide, and may comprise a mixture of at least two transition metal oxides, in which a conductive filament may be formed using electrical signals. Suitable transition metals are, for example, niobium, titanium, nickel, chromium, cobalt, manganese, vanadium, tantalum, hafnium, or iron. Furthermore, the programmable resistance layer 22 may comprise an additional metal, such as strontium, lead, praseodym, or calcium. The mixed oxide material may be deposited using reactive co-sputtering, chemical vapor deposition (CVD), or atomic layer deposition (ALD). The initial resistance, the resistance in a high-resistive state, the resistance in a low-resistive state, or a temperature-dependent resistance of the programmable resistance layer 22 may be tuned by means of the composition of the mixture of the at least two transition metal oxides and an optional addition of further doping materials. In this way, a further optimization of the required programming and sensing currents may achieved. The initial resistance also determines the initial voltage, which is required to form the first filaments. Without tuning this initial voltage may exceed a permissible breakdown voltage, which is determined by the structure and the materials of the electrodes, masks, programmable layers, or isolators. Applying a greater voltage than permissible may cause substantial damage to the cell or even may render the cell dysfunctional. Furthermore, a smaller filament may be interrupted by means of a lower current, and hence requires a decreased reset-voltage for reversing the programmable resistive cell from a low-resistive state to high-resistive one.

Figure 2D:
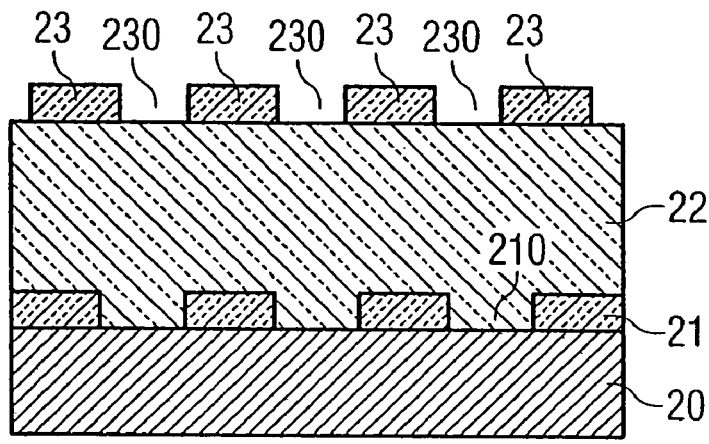
Figure 2E:
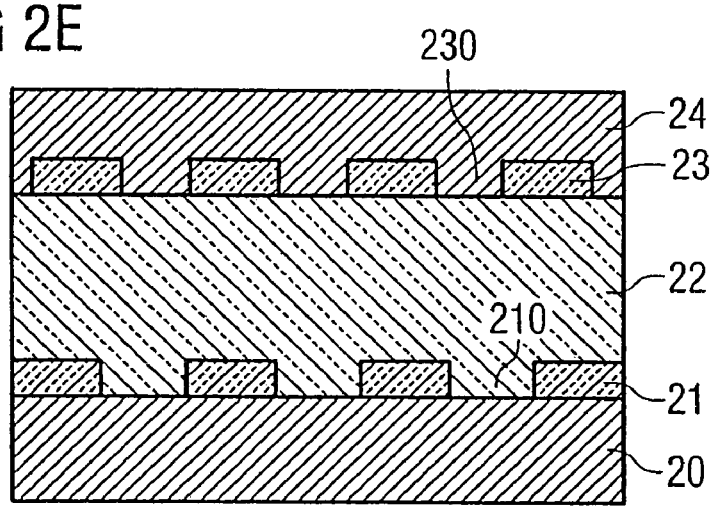

The first programmable resistance layer 22 may also fill the free regions 210 of the first lower mask 21 and may adjoin the first lower electrode 20. A first upper mask 23, comprising open regions 230 between current-inhibiting regions is provided on the first programmable resistance layer 22, as shown in FIG. 2D. A first upper electrode 24 is provided atop the first upper mask 23. In this case, the first upper mask 23 and the first upper electrode 24 may be fabricated in an analogous manner using fabrication techniques and materials as described in conjunction to the first lower mask 21 and the first lower electrode 20. The first upper electrode 24 may fill the open regions 230 of the first upper mask 23 and thus adjoins the first programmable resistance layer 22, as shown in FIGS. 2D and 2E.

Figure 2F:
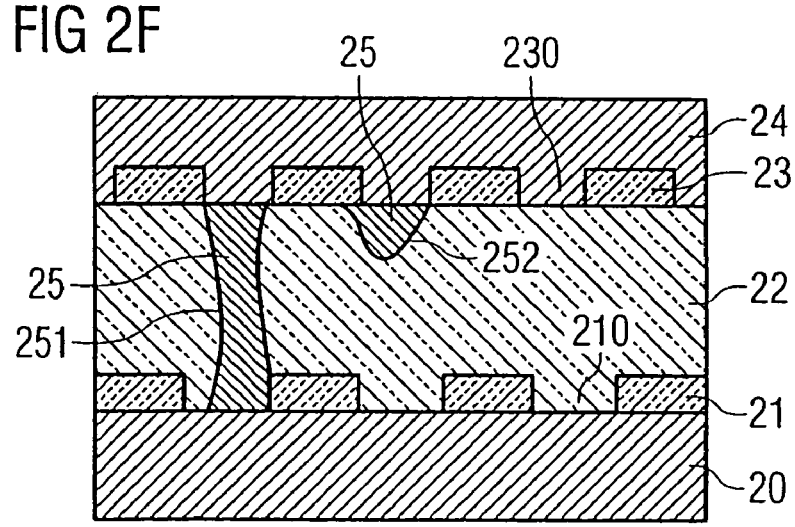

Applying electrical signals between the first lower electrode 20 and the first upper electrode 24 allows for a formation of a conductive region 25 in the first programmable resistance layer 22, as shown in FIG. 2F. The conductive region 25 comprises at least one continuous filament 251 and further filaments 252 which may be only partially formed. The first lower mask 21 and the first upper mask 23 may be oriented with respect to one another in such a manner that the effective contact area, formed by the open regions 210 of the first lower mask 21 and the open regions 230 of the first upper mask 23, is minimized. The region in which the conductive region 25 can form in the first programmable resistance layer 22 is thus reduced. Only a few partially formed filaments 252 are thus produced, and the spatial extent of continuous regions, for example the first continuous filament 251, is also minimized. The volume which must be changed in order to program the conductivity of the programmable resistance layer is thus reduced overall.

The region which is heated in order to change the electrical conductivity is thus minimized, and the required programming current is thus considerably reduced. The programmable resistive memory cell, according to the invention, thus requires considerably lower programming currents and may thus be operated with a reduced power consumption. This is of interest also in mobile applications and, in addition, also considerably reduces the waste heat produced in the components.

Figure 3A:
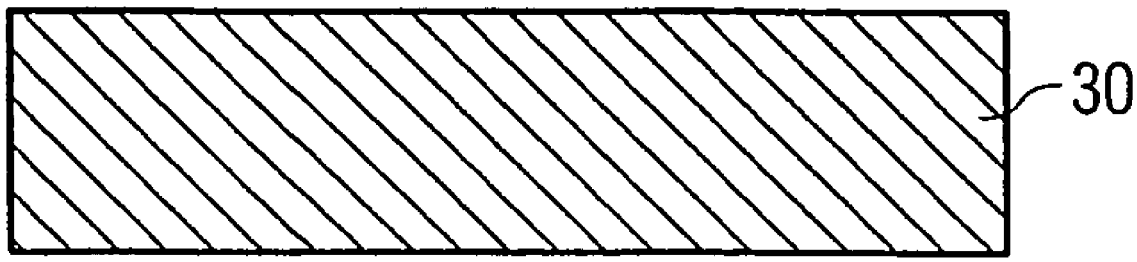
FIGS. 3A through 3I show a schematic view of a programmable resistive memory cell at various stages during production according to a second embodiment of the present invention.

FIGS. 3A to 3I schematically show a programmable resistive memory cell at various stages during fabrication. As shown in FIG. 3A, a substrate 30, for example a silicon substrate, is provided. The substrate 30 also may comprise other functional elements, which have already been formed on the substrate 30, as is common in semiconductor fabrication.

Figure 3B:
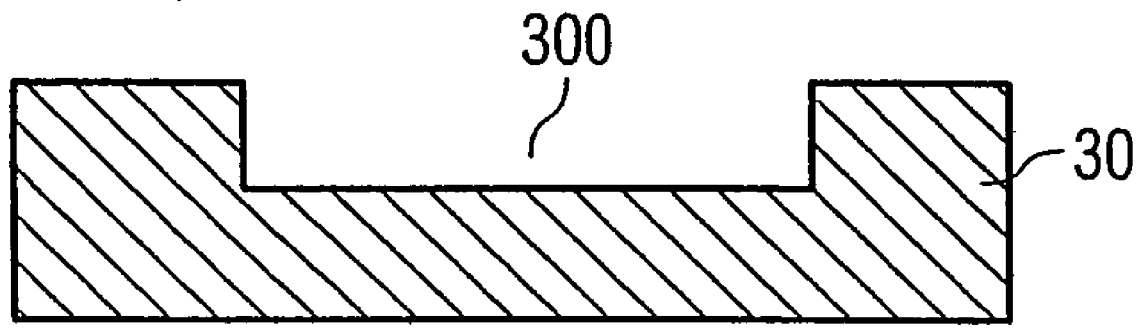
Figure 3C:
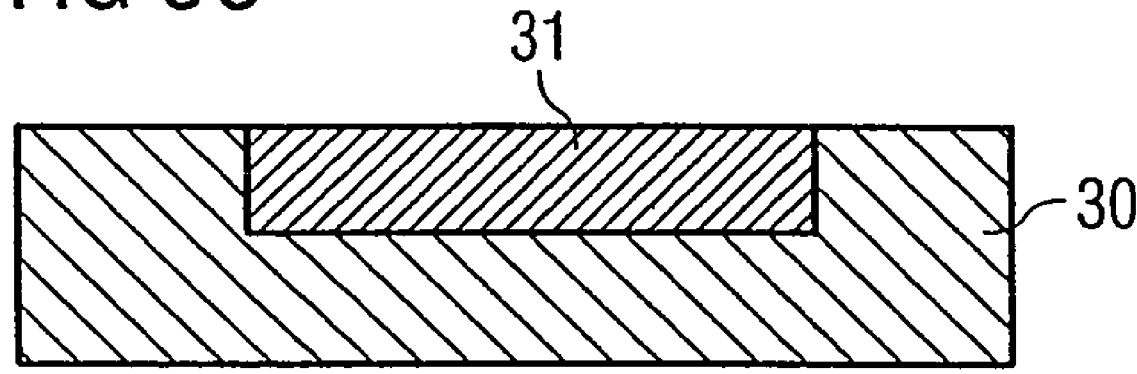

As shown in FIG. 3B, a trench 300 is formed in the substrate 30. This may be effected using directional or nondirectional etching methods, also in conjunction with etching masks. The trench 300 in the substrate 30 is used as a mold for a second lower electrode 31, as shown in FIG. 3C. In order to form the second lower electrode 31, the trench 300 is at first filled with a conductive material, after which the conductive material and, if appropriate, also the substrate 30 are polished in order to provide a planar surface for the further production steps. In this case, polishing may be effected using chemical mechanical polishing (CMP).

Figure 3D:
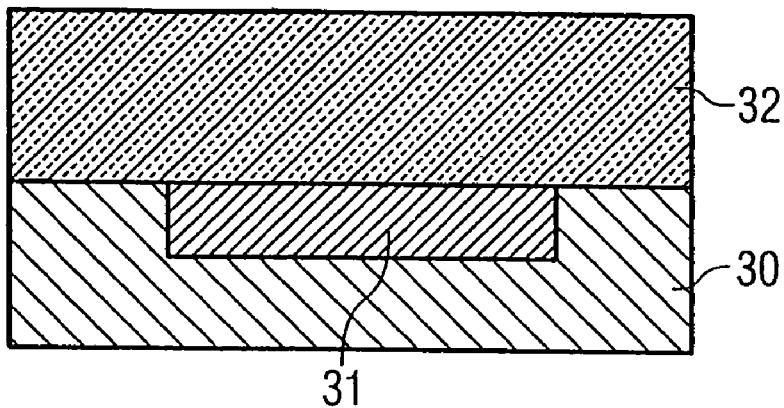
Figure 3E:
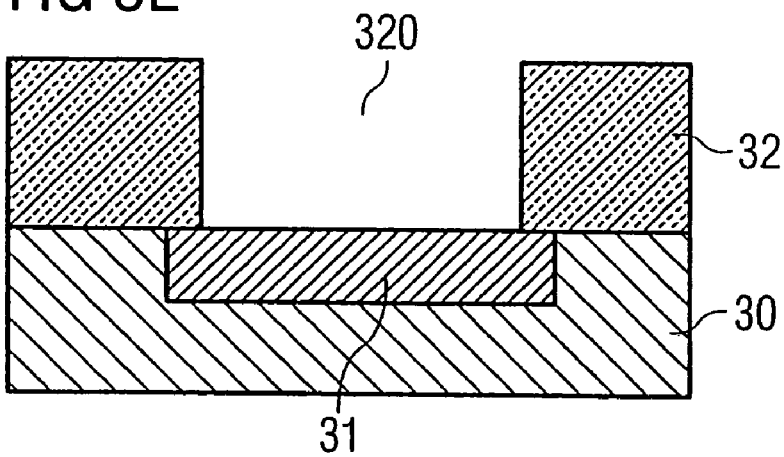
Figure 3F:
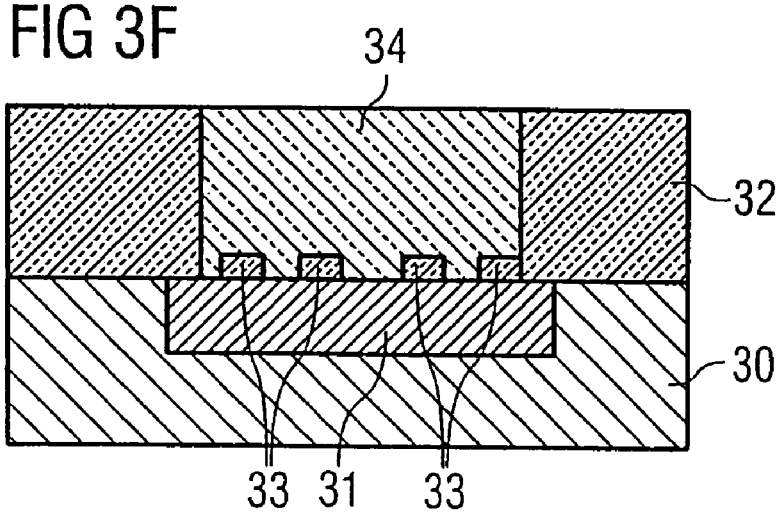

As shown in FIG. 3D, a lower insulating layer 32 is provided atop the substrate 30. A trench 320 for opening the second lower electrode 31 is formed in this lower insulating layer 32, as shown in FIG. 3E. A second lower mask 33 is formed on the second lower electrode 31, after which the trench 320 and the free regions of the second lower mask 33 are filled with a second programmable resistance layer 34, as shown in FIG. 3F. If appropriate, a polishing operation may be effected again in order to provide a planar surface.

Figure 3G:
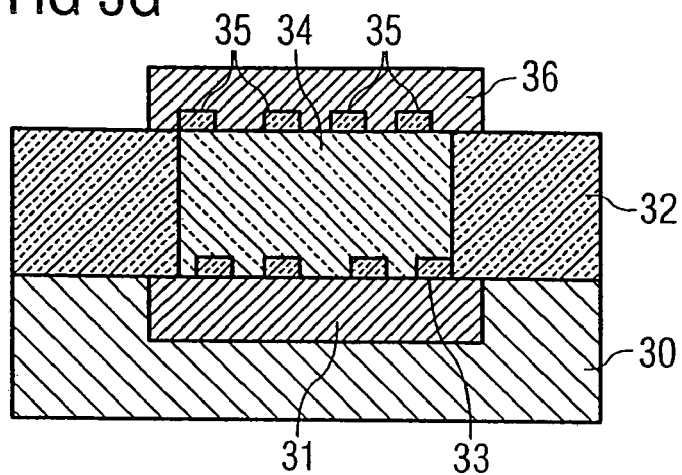
Figure 3H:
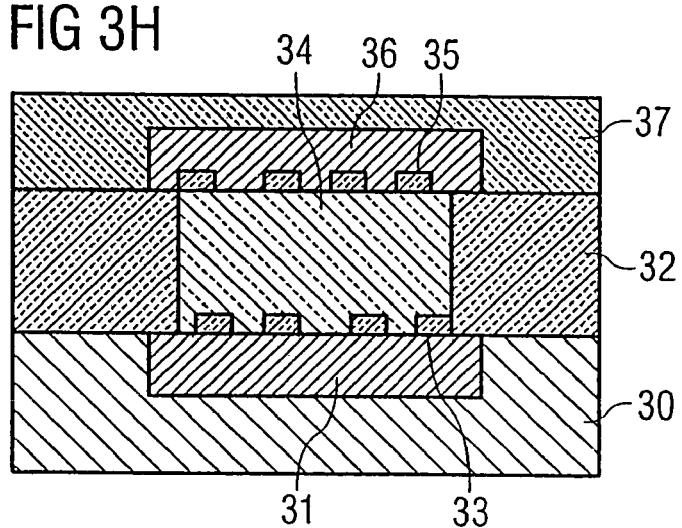

A second upper mask 35 and a second upper electrode 36 are provided atop the second programmable resistance layer 34, as shown in FIG. 3G. As shown in FIG. 3H, the programmable resistive memory cell may finally be provided with an upper insulating layer 37 in order to passivate and protect it, after which further process steps, such as contacting, may be effected.

Figure 3I:
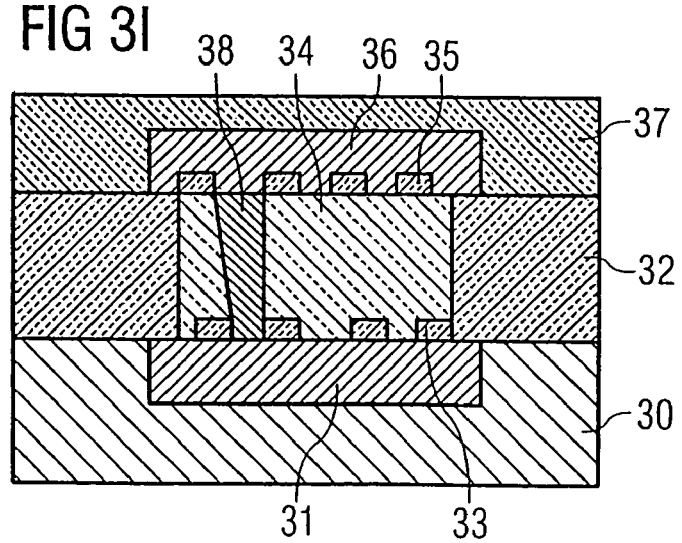

Applying electrical signals to the second lower electrode 31 and to the second upper electrode 36 allows for a formation of a conductive filament 38 in the second programmable resistance layer 34, as shown in FIG. 3I, or to be caused to recede, as shown in FIG. 3H. Providing the second lower mask 33 and the second upper mask 35 reduces the effective contact area between the second lower electrode 31 and the second programmable resistance layer 34 and between the second upper electrode 36 and the second programmable resistance layer 34. This inhibits the formation of filaments, which are not essential to programming the memory cell, in the second programmable resistance layer 34, and effective use is made of the programming current for forming an individual thin continuous filament 38, and for causing said filament to recede.

As far as the fabrication and the materials of the masks 33, 35, of the electrodes 31, 36, and of the resistance layer 34 is concerned, use is made of the techniques and materials described in conjunction with FIGS. 2A to 2F.

Figure 4A:
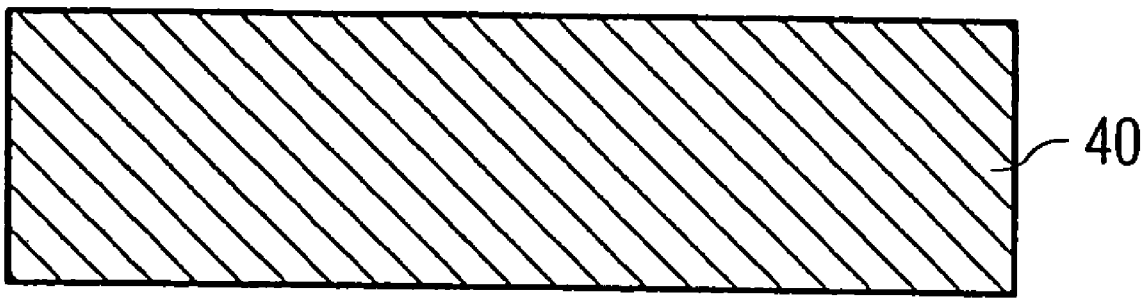
Figure 4B:
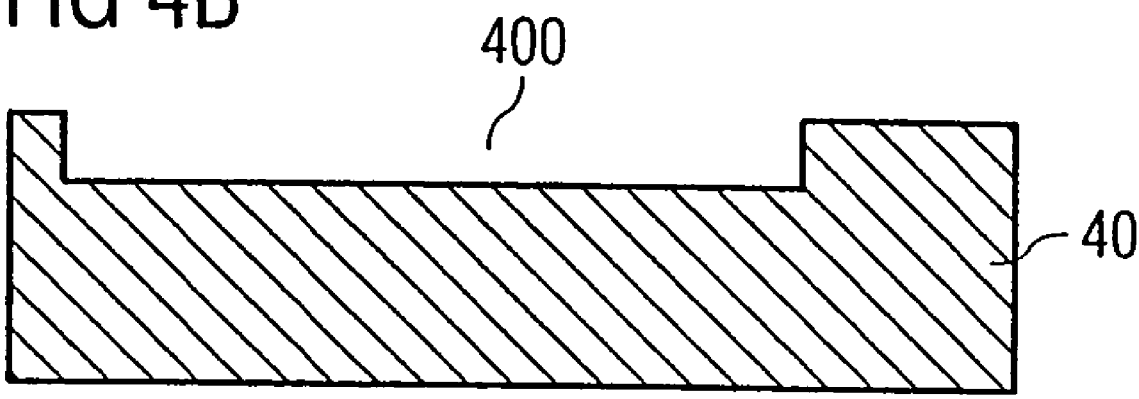
Figure 4C:
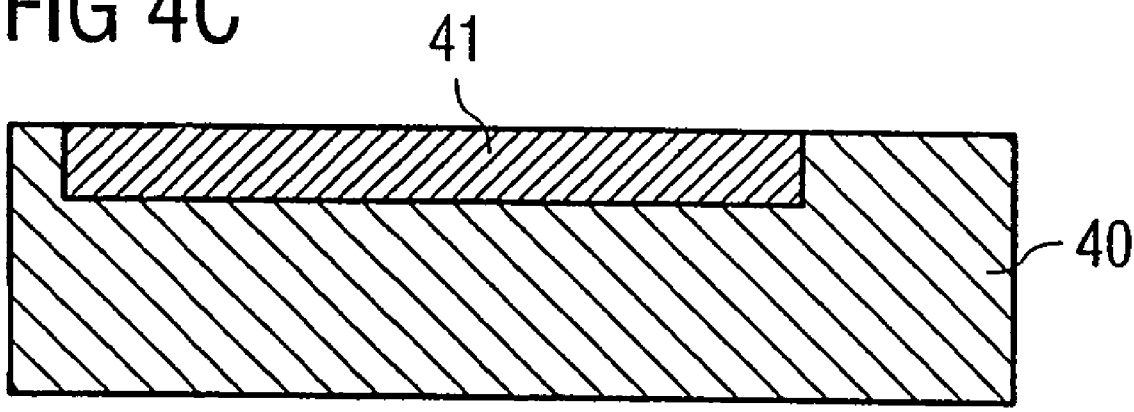

FIGS. 4A to 4H schematically show a programmable resistive memory cell at various stages during fabrication according to a third embodiment of the present invention. Starting from the substrate 40 shown in FIG. 4A, a trench 400 is formed in the substrate 40, as shown in FIG. 4B. The substrate 40 may comprise a silicon substrate or other functional elements, which have already been formed on the substrate 40, as is common in semiconductor fabrication. The trench 400 in the substrate 40 is used to form a third lower electrode 41, as shown in FIG. 4C. The surfaces of the third lower electrode 41 and of the substrate 40 may be polished in order to provide a planar surface for the subsequent process steps.

As shown in FIG. 4D, a contact mold layer 420 and a contact 430 are provided on the substrate 40 and on the third lower electrode 41. The contact mold layer 420 may comprise $SiO_2$ or $Si_3N_4$, deposited, for example, employing a CVD technique. The contact 430 may have a downward tapered shape. The opening in the contact mold layer 420 may also be provided sub-lithographically such that it provides a contact area, which is as smaller than attainable by means of conventional lithography techniques. Starting from the contact mold layer 420 and the contact 430 as shown in FIG. 4D, the contact mold layer 420 and the contact 430 may be polished and their height may thus be recessed. The downwardly tapered design of the contact 430 reduces the surface of the contact 43 while being polished, as shown in FIG. 4E. If the desired surface of the contact 43 and the desired height of the contact 43 and of the contact mold layer 42 have been achieved by means of appropriate polishing, an intermediate insulating layer 45 with a trench is provided atop the contact 43 and the contact mold layer 42. A third lower mask 44 is provided atop the contact 43, and the trench and the open regions of the third lower mask 44 are filled with a third programmable resistance layer 46. Polishing may then be effected again.

Figure 4G:
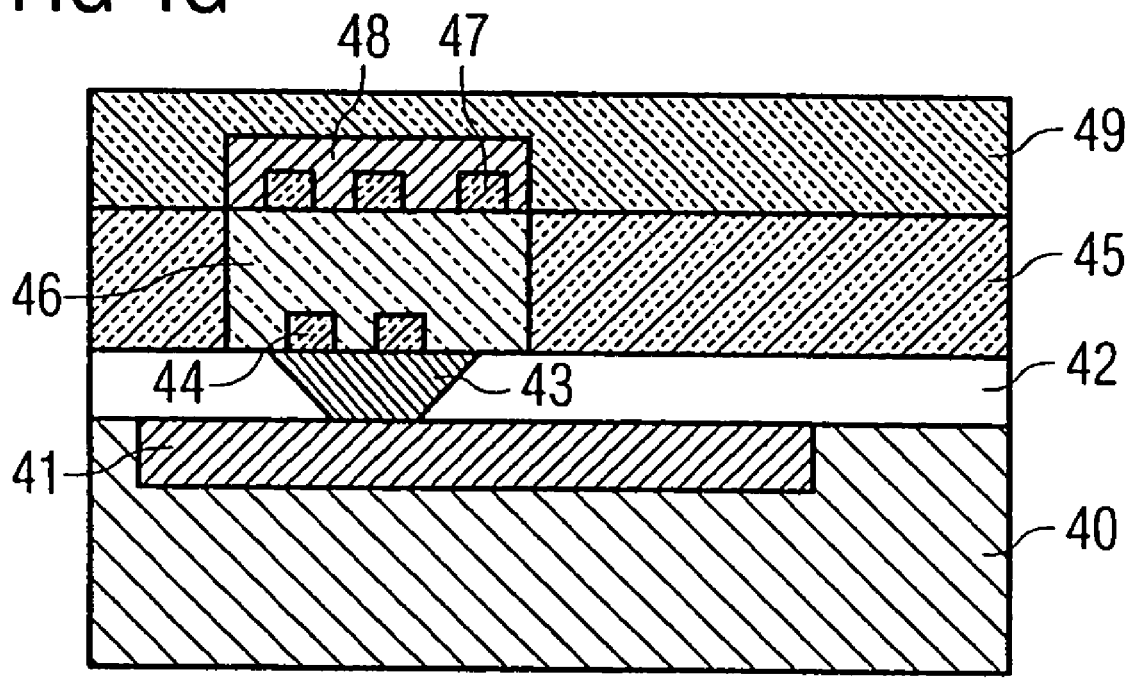
Figure 4H:
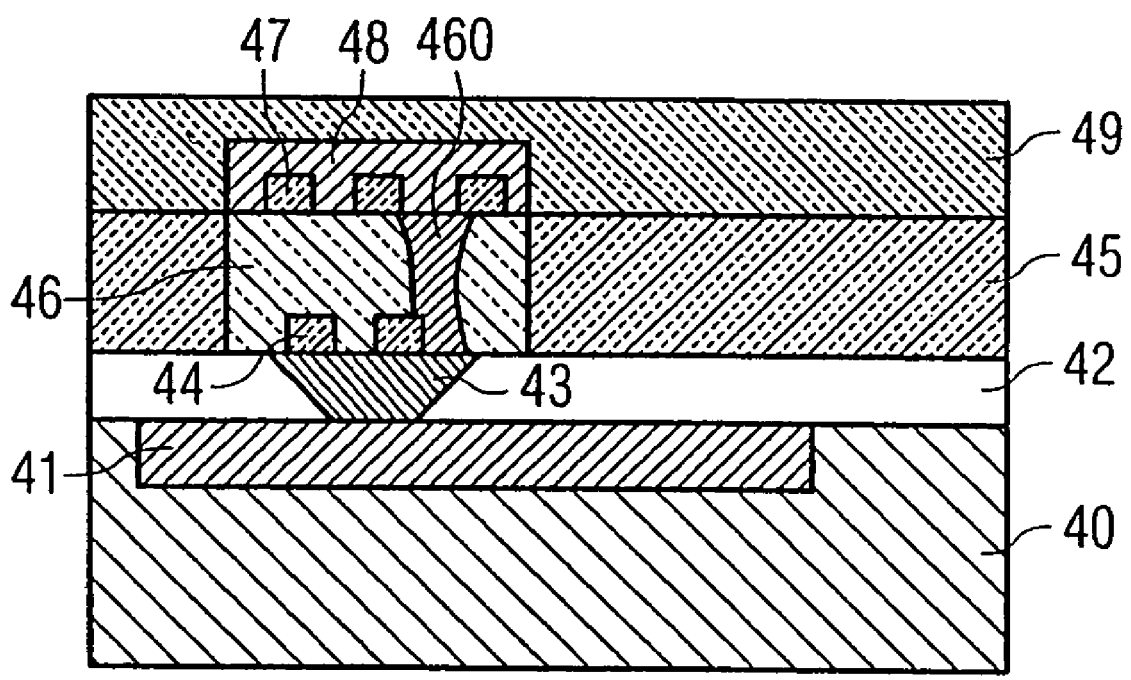

A third upper mask 47 and a third upper electrode 48 are formed on the third programmable resistance layer 46, as shown in FIG. 4F. In order to passivate and protect the programmable resistive memory cell, a further, upper insulating layer 49 may be applied, as shown in FIG. 4G. According to this embodiment of the present invention, the plug contact comprising the third lower electrode 41 and the contact 43 further reduces the effective contact area between the contact 43 and the third programmable resistance layer 46 and thus, in conjunction with the third lower mask 44 and the third upper mask 47, greatly restricts the region in which a conductive filament 460 can form. As shown in FIG. 4H, a continuous conductive filament 460 can form only at particular locations, and the amount of current required to program the resistive memory cell is thus considerably reduced.

As far as the fabrication techniques and materials of the masks 44, 47, of the electrodes or contacts 41, 43, 48 and of the resistance layer 46 are concerned, use is made of the techniques and materials as described in conjunction with FIGS. 2A to 2F.

Figure 5A:
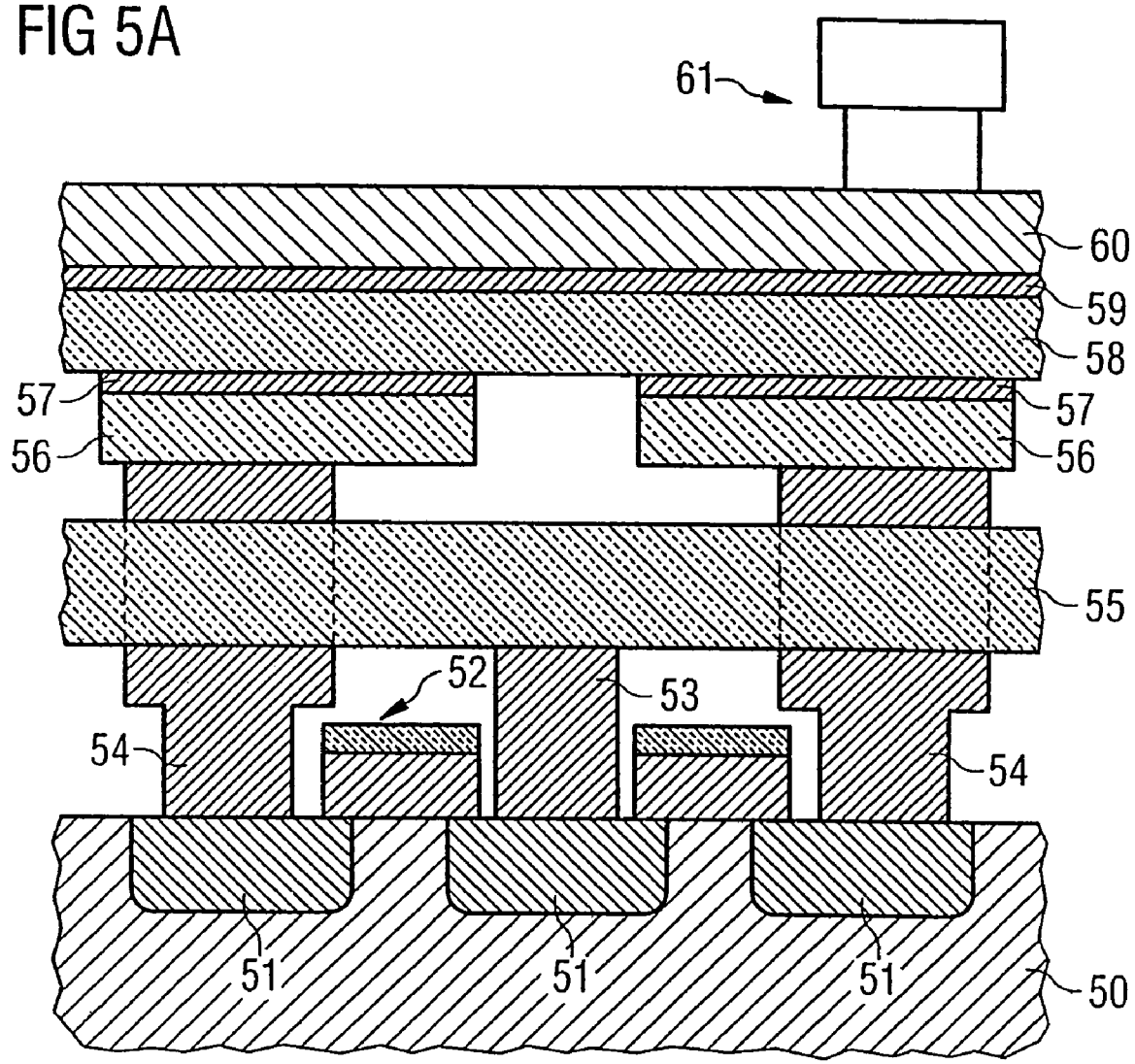
FIGS. 5A and 5B show a schematic view of a programmable resistive memory cell being part of an integrated circuit, according to the fourth embodiment of the present invention.
Figure 5B:
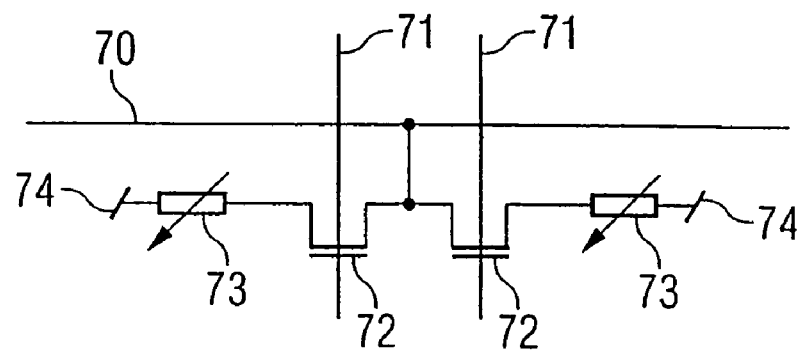

FIGS. 5A and 5B show a schematic view of a programmable resistive memory cell being part of an integrated circuit, according to a fourth embodiment of the present invention. As shown in FIG. 5A, first, doped regions 51 are provided in a substrate 50. Therein, a doped region 51 is connected through a via 53 to a bit line 55. Word lines 52 comprise a gate electrode and thus control the conduction between the doped regions 51. The doped regions 51 can also be coupled to bottom electrodes 56 with vias 54. On top of the bottom electrodes 56 a lower mask 57 is arranged. Between the lower mask 57 and an upper mask 59, a programmable resistance layer 58 is arranged, in which filaments may be formed and interrupted by electrical signals. A top electrode 60 is connected to further components of the integrated circuit through a via 61.

By activating the corresponding bit line 55 and the corresponding word line 52, an electrical signal can be applied between the via 61, the top electrode 60, the upper mask 59, the programmable resistance layer 58, the lower mask 57, the bottom electrode 56, the via 54 two adjacent doped regions 51—coupled by means of the corresponding word line 52, the via 53, and the bit line 55, for programming or reading-out a resistive state of a region of the programmable resistance layer 58.

In FIG. 5B, two resistive memory cells 73 are shown schematically in a circuit diagram. The resistive memory cells 73 are connected to a common bit line 70 through selection transistors 72. By corresponding activation of the selection transistors 72 with the word lines 71, an electrical signal can be applied between the bit line 70, through an enabled selection transistor 72, a resistive storage cell 73 and the electrode 74. This electrical signal can be effected for generating a current through the corresponding resistive storage cell 73 for programming or for reading-out the cell's resistive state. An integrated storage device then contains a plurality of resistive storage cells 73, each being associated to a selection transistor 72, and a corresponding set of bit lines 70 and a set of word lines 71, the latter two often being arranged perpendicularly to each other.

With regard to the fabrication and the materials of the masks 57, 59, the electrodes and contacts 56, 60, and the programmable resistance layer 58, the techniques and materials as described in conjunction with FIGS. 2A through 2F may be employed.

The preceding description only describes advantageous exemplary embodiments of the invention. The features disclosed therein and the claims and the drawings can, therefore, be essential for the realization of the invention in its various embodiments, both individually and in any combination. While the foregoing is directed to embodiments of the present invention, other and further embodiments of this invention may be devised without departing from the basic scope of the invention, the scope of the present invention being determined by the claims that follow.

What is claimed is:

1. A programmable resistive memory cell, comprising:
a lower electrode;
a programmable resistance layer; and
an upper electrode,
wherein a lower mask is arranged between the lower electrode and the programmable resistance layer and an upper mask is arranged between the programmable resistance layer and the upper electrode, and the lower mask and the upper mask comprise current-inhibiting regions,
wherein at least two separate contact areas between the lower electrode and the programmable resistance layer are formed by the current-inhibiting regions of the lower mask.

2. The memory cell as claimed in claim 1, wherein the current-inhibiting regions comprise an insulator.

3. The memory cell as claimed in claim 2, wherein the current-inhibiting regions comprise a metal oxide.

4. The memory cell as claimed in claim 3, wherein the current inhibiting regions comprise zinc oxide.

5. The memory cell as claimed in claim 1, wherein a lateral extent of the current-inhibiting regions is in a range of 2 to 20 nm.

6. The memory cell as claimed in claim 1, wherein open regions are arranged between two adjacent current-inhibiting regions, and the open regions have a lateral extent in a range of 2 to 20 nm.

7. The memory cell as claimed in claim 1, wherein a layer thickness of the lower mask and of the upper mask are in a range of 1 to 10 nm.

8. The memory cell as claimed in claim 1, wherein the lower mask is arranged such that it adjoins the lower electrode on an underside and elsewhere adjoins the programmable resistance layer.

9. The memory cell as claimed in claim 1, wherein the upper mask is arranged such that it adjoins the programmable resistance layer on an underside and elsewhere adjoins the upper electrode.

10. The memory cell as claimed in claim 1, wherein the programmable resistance layer comprises a transition metal oxide.

11. The memory cell as claimed in claim 10, wherein the programmable resistance layer comprises a further transition metal oxide.

12. The memory cell as claimed in claim 10, wherein at least one of the transition metals niobium, titanium, nickel, zirconium, chromium, cobalt, manganese, vanadium, tantalum, hafnium, or iron forms an oxide.

13. The memory cell as claimed in claim 10, wherein the programmable resistance layer comprises at least one of the metals strontium, lead, praseodymium or calcium.

14. The memory cell as claimed in claim 1, wherein the programmable resistance layer is surrounded by an insulating layer.

15. The memory cell as claimed in claim 1, wherein the lower electrode and the upper electrode comprise at least one of the metals tungsten, platinum or palladium.

16. A programmable resistive memory cell, comprising:
a lower electrode;
a contact;
a programmable resistance layer; and
an upper electrode,
wherein a lower mask is arranged between the contact and the programmable resistance layer, the lower mask comprises current-inhibiting regions, the contact is arranged between the lower electrode and the lower mask, and the contact being surrounded by an insulating contact mold layer; and
wherein the contact is tapered downward.

17. The memory cell as claimed in claim 16, wherein an upper mask is arranged between the programmable resistance layer and the upper electrode.

18. A programmable resistive memory cell, comprising:
a lower electrode;
a programmable resistance layer; and
an upper electrode,
wherein a lower mask is arranged between the lower electrode and the programmable resistance layer and an upper mask is arranged between the programmable resistance layer and the upper electrode, and the lower mask and the upper mask comprise current-inhibiting regions, the current-inhibiting regions each comprising at least one nanoparticle, the lateral extent of the nanoparticles being in a range of 2 to 20 nm.

19. The memory cell as claimed in claim 18, wherein the nanoparticles comprise a metal oxide.

20. The memory cell as claimed in claim 19, wherein the nanoparticles comprise zinc oxide.

21. A programmable resistive memory cell, comprising:
a lower electrode;
a programmable resistance layer; and
an upper electrode,
wherein a lower mask is arranged between the lower electrode and the programmable resistance layer and an upper mask is arranged between the programmable resistance layer and the upper electrode, and the lower mask and the upper mask comprise current-inhibiting regions, and
wherein the current-inhibiting regions comprise an insulator comprising a metal oxide.

22. The memory cell as claimed in claim 21, wherein the current inhibiting regions comprise zinc oxide.

* * * * *